(12) United States Patent
Zhang et al.

(10) Patent No.: US 11,217,727 B2
(45) Date of Patent: Jan. 4, 2022

(54) LIGHT EMITTING DIODE

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 31 days.

(21) Appl. No.: 16/903,164

(22) Filed: Jun. 16, 2020

(65) Prior Publication Data

US 2021/0143301 A1 May 13, 2021

(30) Foreign Application Priority Data

Nov. 8, 2019 (CN) .......................... 201911089309.1

(51) Int. Cl.
*H01L 33/42* (2010.01)
*H01L 33/00* (2010.01)
*H01L 33/06* (2010.01)
*H01L 33/60* (2010.01)
*H01L 33/32* (2010.01)
*H01L 33/26* (2010.01)
*H01L 33/22* (2010.01)

(52) U.S. Cl.
CPC .......... *H01L 33/42* (2013.01); *H01L 33/0012* (2013.01); *H01L 33/06* (2013.01); *H01L 33/22* (2013.01); *H01L 33/26* (2013.01); *H01L 33/32* (2013.01); *H01L 33/60* (2013.01)

(58) Field of Classification Search
CPC ..... H01L 33/42; H01L 33/0012; H01L 33/06; H01L 33/22; H01L 33/26; H01L 33/32; H01L 33/60
See application file for complete search history.

(56) References Cited

U.S. PATENT DOCUMENTS

| 7,719,032 B2 | 5/2010 | Maruyama et al. |
| 9,773,990 B1* | 9/2017 | Zhang ............... H01L 29/66969 |
| 9,947,869 B2* | 4/2018 | Zhang ..................... C30B 29/46 |

(Continued)

FOREIGN PATENT DOCUMENTS

| JP | 2004-171903 | 6/2004 |
| JP | 2005-116618 | 4/2005 |

(Continued)

*Primary Examiner* — Mark W Tornow
(74) *Attorney, Agent, or Firm* — ScienBiziP, P.C.

(57) ABSTRACT

The present disclosure relates to a light emitting diode. The light emitting diode comprises a first semiconductor layer, a second semiconductor layer, an active layer, a first electrode, and a second electrode. The active layer is located between the first semiconductor layer and the second semiconductor layer. The first electrode is a first carbon nanotube, the second electrode is a second carbon nanotube. A first extending direction of the first carbon nanotube and a second extending direction of the second carbon nanotube are crossed with each other. A vertical p-n junction or a vertical p-i-n junction is formed by the first semiconductor layer and the second semiconductor layer in a direction perpendicular to the first semiconductor layer.

20 Claims, 3 Drawing Sheets

(56) References Cited

U.S. PATENT DOCUMENTS

| | | | |
|---|---|---|---|
| 10,020,190 B2 * | 7/2018 | Zhang | H01L 21/02606 |
| 11,069,868 B2 * | 7/2021 | Zhang | H01L 31/1136 |
| 2005/0199894 A1 * | 9/2005 | Rinzler | B82Y 10/00 257/94 |
| 2012/0273755 A1 * | 11/2012 | Wei | H01L 33/14 257/13 |
| 2017/0271551 A1 * | 9/2017 | Kim | B82Y 20/00 |
| 2018/0006227 A1 | 1/2018 | Zhang et al. | |
| 2018/0006231 A1 | 1/2018 | Zhang et al. | |
| 2018/0006252 A1 | 1/2018 | Zhang et al. | |
| 2018/0006255 A1 | 1/2018 | Zhang et al. | |
| 2018/0342580 A1 | 11/2018 | Zhang et al. | |
| 2018/0342632 A1 | 11/2018 | Zhang et al. | |
| 2018/0342690 A1 | 11/2018 | Zhang et al. | |

FOREIGN PATENT DOCUMENTS

| | | |
|---|---|---|
| JP | 2012-146982 | 8/2012 |
| JP | 2018-6754 | 1/2018 |
| JP | 2018-006755 | 1/2018 |
| JP | 2018-198312 | 12/2018 |
| JP | 2018-198313 | 12/2018 |
| JP | 2018-198314 | 12/2018 |
| TW | 201802025 | 1/2018 |
| TW | 201802951 | 1/2018 |
| TW | 201803147 | 1/2018 |
| TW | 201901937 | 1/2019 |
| TW | I656654 | 4/2019 |

* cited by examiner

LIGHT EMITTING DIODE

CROSS-REFERENCE TO RELATED APPLICATIONS

This application claims all benefits accruing under 35 U.S.C. § 119 from China Patent Application No. 201911089309.1, filed on Nov. 8, 2019, in the China Intellectual Property Office, the contents of which are hereby incorporated by reference. The application is also related to co-pending applications entitled, "PHOTOELECTRIC DETECTOR", filed Jun. 16, 2020 Ser. No. 16/903,161. The application is also related to co-pending applications entitled, "SOLAR BATTERY", filed Jun. 16, 2020. The application is also related to co-pending applications entitled, "SEMICONDUCTOR STRUCTURE AND SEMICONDUCTOR DEVICE USING THE SAME", filed Jun. 16, 2020 Ser. No. 16/903,171

FIELD

The present disclosure relates to a light emitting diode (LED), especially relates to a nano-sized light emitting diode.

BACKGROUND

A typical LED commonly includes an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. In operation, a positive voltage and a negative voltage are applied respectively to the P-type semiconductor layer and the N-type semiconductor layer. Thus, holes in the P-type semiconductor layer and photons in the N-type semiconductor layer can enter the active layer and combine with each other to emit visible light.

Conventional LEDs are large in size, and nano-sized light-emitting diodes have not yet been obtained. Therefore, an application of light-emitting diodes is greatly limited. Furthermore, P-type electrodes and N-type electrodes of the conventional LEDs absorb or reflect light. Such absorption or reflection of light reduce the light-emitting effect of the conventional LEDs.

BRIEF DESCRIPTION OF THE DRAWINGS

Implementations of the present technology will now be described, by way of example only, with reference to the attached figures, wherein.

DETAILED DESCRIPTION

Figure 1:
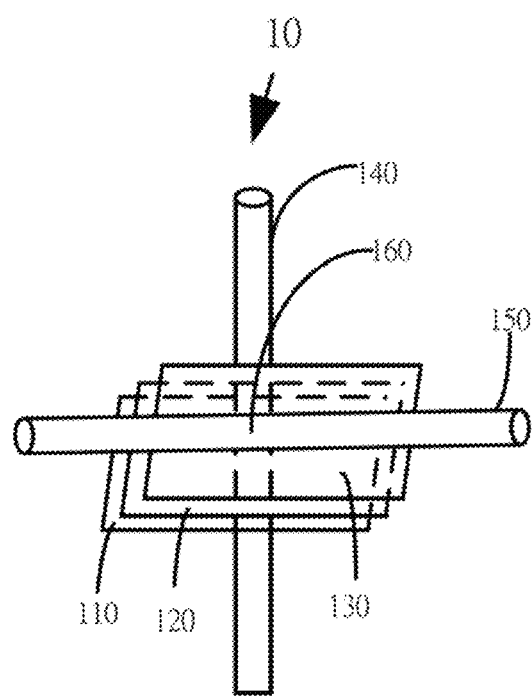
FIG. 1 is a structural schematic view of one embodiment of a light emitting diode.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 2:
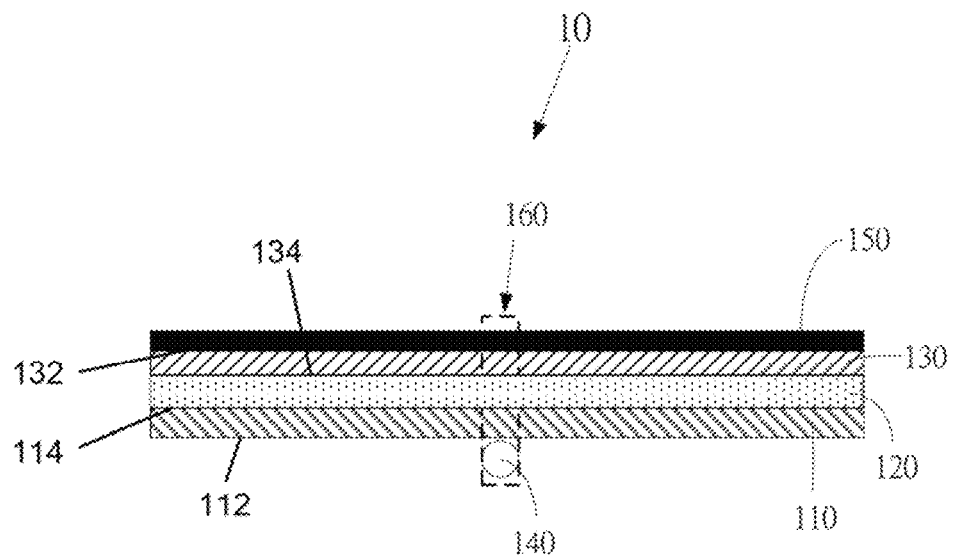
FIG. 2 is a side structural schematic view of one embodiment of the light emitting diode.

Referring to FIG. 1 and FIG. 2, one embodiment is described in relation to a light emitting diode 10. The light emitting diode 10 comprises a first semiconductor layer 110, an active layer 120, a second semiconductor layer 130, a first electrode 140, and a second electrode 150. The first semiconductor layer 110, the active layer 120, and the second semiconductor layer 130 are stacked with each other, and the active layer 120 is located between the first semiconductor layer 110 and the second semiconductor layer 130. A vertical p-n junction or a vertical p-i-n junction is formed by the first semiconductor layer 110 and the second semiconductor layer 130 in a direction perpendicular to the first semiconductor layer 110 and the second semiconductor layer 130. A surface of the first semiconductor layer 110 is defined as a first surface 112, another surface of the first semiconductor layer 110 opposite to the first surface is defined as a second surface 114. The first electrode 140 is located on the first surface 112 and in direct contact with the first surface 112. The second surface 114 is in direct contact with a surface of the active layer 120. A surface of the second semiconductor layer 130 is defined as a third surface 132, another surface of the second semiconductor layer 130 opposite to the third surface is defined as a fourth surface 134. The second electrode 150 is located on the third surface 132 and is in direct contact with the third surface 132. The fourth surface 134 is in contact with another surface of the active layer 120. The first electrode 140 may be one first carbon nanotube, the second electrode 150 may be one second carbon nanotube, and a first extending direction of the first carbon nanotube intersects with a second extending direction of the second carbon nanotube. In one embodiment, the first electrode 140 is a single first carbon nanotube, the second electrode 150 is a single second carbon nanotube, and a first extending direction of the first carbon nanotube intersects with a second extending direction of the second carbon nanotube.

Each of the first semiconductor layer 110 and the second semiconductor layer 130 is a two-dimensional material. The two-dimensional material refers to a material in which electrons can perform plane movement freely only on a nanometer scale (1-100 nm) in two dimensions, such as nanofilms, superlattices, quantum wells, etc. When the first semiconductor layer 110 is an N-type semiconductor layer, the second semiconductor layer 130 is a P-type semiconductor layer. When the first semiconductor layer 110 is a P-type semiconductor layer, the second semiconductor layer 130 is an N-type semiconductor layer. An N-type semiconductor layer is used to provide electrons, and a P-type semiconductor layer functions to provide holes. A material of the P-type semiconductor layer and a material of the N-type semiconductor layer can be an inorganic compound semiconductor, an element semiconductor, an organic semiconductor material, or a material doped with the inorganic compound semiconductor, the element semiconductor, or the organic semiconductor material. The material of the N-type semiconductor layer can be N-type gallium nitride, N-type gallium arsenide, N-type copper phosphide, or molybdenum disulfide ($MoS_2$). The material of the P-type semiconductor layer can be P-type gallium nitride, P-type gallium arsenide, P-type copper phosphide or tungsten diselenide ($WSe_2$). In one embodiment, a thickness of the first semiconductor layer 110 ranges from about 0.5 nanometers to about 100 nanometers. In one embodiment, the thickness of the first semiconductor layer 110 ranges from about 0.5 nanometers to about 50 nanometers. In one embodiment, the first semiconductor layer 110 is an N-type semiconductor layer with a thickness of 16 nanometers, and the material of the N-type semiconductor layer is $MoS_2$.

In one embodiment, the active layer 120 covers an entire surface of the second surface of the first semiconductor layer 110. The active layer 120 is a quantum well structure comprising one or more quantum well layers. The active layer 120 is used to provide photons. A material of the active layer 120 can be gallium nitride, indium gallium nitride, indium gallium aluminum nitride, arsenide, aluminum arsenide, indium gallium phosphide, indium arsenic phosphide, or indium gallium arsenide. A thickness of the active layer 120 ranges from about 10 nanometers to about 100 nanometers. In one embodiment, the active layer 120 is a gallium nitride layer with a thickness of about 30 nanometers.

In one embodiment, the second semiconductor layer 130 covers an entire surface of the active layer 120 away from the first semiconductor layer 110. In one embodiment, a thickness of the second semiconductor layer 130 ranges from about 0.5 nanometers to about 100 nanometers. In one embodiment, the thickness of the second semiconductor layer 130 ranges from about 0.5 nanometers to about 50 nanometers. The second semiconductor layer 130 can be an N-type semiconductor layer or a P-type semiconductor layer, and the second semiconductor layer 130 and the first semiconductor layer 110 belong to two different types of semiconductor layers. The third surface of the second semiconductor layer 130 is as a light emitting surface of the light emitting diode 10. In one embodiment, the second semiconductor layer 130 is a tungsten diselenide layer with a thickness of 14 nanometers.

The first carbon nanotube is a metal carbon nanotube. The first carbon nanotube can be a single-walled carbon nanotube, a double-walled carbon nanotube, or a multi-walled carbon nanotube. In one embodiment, a diameter of the first carbon nanotube ranges from about 0.5 nanometers to about 100 nanometers. In one embodiment, the diameter of the first carbon nanotube ranges from about 0.5 nanometers to about 10 nanometers. In one embodiment, the first carbon nanotube is the single-walled carbon nanotube, and the diameter of the first carbon nanotube ranges from about 0.5 nanometers to about 2 nanometers. In one embodiment, the diameter of the first carbon nanotube is 1.0 nanometer. In one embodiment, the first carbon nanotube is an inner shell carbon nanotube. The inner shell carbon nanotube refers to the innermost wall of carbon nanotube of the double-walled carbon nanotube or the multi-walled carbon nanotube. The inner shell carbon nanotube can be pulled out from an ultra-long double-walled carbon nanotube or an ultra-long multi-walled carbon nanotube. A length of the ultra-long double-walled carbon nanotube or the ultra-long multi-walled carbon nanotube is larger than 150 micrometers. In one embodiment, the length of the ultra-long double-walled carbon nanotube or the ultra-long multi-walled carbon nanotube ranges from about 150 micrometers to about 300 micrometers. A method of obtaining the inner shell carbon nanotube comprises stretching two ends of the ultra-long double-walled carbon nanotube or the ultra-long multi-walled carbon nanotube, where outer walls of the ultra-long double-walled carbon nanotube or the ultra-long multi-walled carbon nanotube are sheared off in the middle part under tension, and the innermost wall of carbon nanotube remains in the middle part of the ultra-long double-walled carbon nanotube or the ultra-long multi-walled carbon nanotube, and selecting a section of the innermost wall of carbon nanotube to obtain the inner shell carbon nanotube. The inner shell carbon nanotube provides a clean surface with no impurities on a surface of the inner shell carbon nanotube; therefore, the first carbon nanotube as the first electrode 140 can be in good contact with the first semiconductor layer 110. The first carbon nanotube is not limited to the inner shell carbon nanotube, the first carbon nanotube can also be other single-walled carbon nanotubes, double-walled carbon nanotubes, or multi-walled carbon nanotubes.

The second carbon nanotube is a metal carbon nanotube. The second carbon nanotube can be a single-walled carbon nanotube, a double-walled carbon nanotube, or a multi-walled carbon nanotube. In one embodiment, a diameter of the second carbon nanotube ranges from about 0.5 nanometers to about 100 nanometers. In one embodiment, the diameter of the second carbon nanotube ranges from about 0.5 nanometers to about 10 nanometers. In one embodiment, the second carbon nanotube is the single-walled carbon nanotube, and the diameter of the second carbon nanotube ranges from about 0.5 nanometers to about 2 nanometers. In one embodiment, the diameter of the second carbon nanotube is 1.0 nanometer. In one embodiment, the second carbon nanotube and the first carbon nanotube are similarly manufactured using a same material, and the material may be the inner shell carbon nanotube. The inner shell carbon nanotube provides a clean surface with no impurities on a surface of the inner shell carbon nanotube; therefore, the second carbon nanotube as the second electrode 150 can be in good contact with the second semiconductor layer 130. The second carbon nanotube is not limited to the inner shell carbon nanotube, and the second carbon nanotube can also be other single-walled carbon nanotubes, double-walled carbon nanotubes, or multi-walled carbon nanotubes.

The first extending direction of the first carbon nanotube intersects with the second extending direction of the second carbon nanotube refers to that an angle is formed between the first extending direction of the first carbon nanotube and the second extending direction of the second carbon nanotube. The angle is larger than 0 degree and less than or equal to 90 degrees. In one embodiment, the first extending direction is perpendicular to the second extending direction, that is, the angle is 90 degrees.

FIG. 2 shows that at an intersection of the first carbon nanotube and the second carbon nanotube and in a direction perpendicular to the first surface 102 of the first semiconductor layer 110, a multilayer structure 160 is formed in an overlapping region of the first electrode 140 (the first carbon nanotube), the first semiconductor layer 110, the active layer 120, the second semiconductor layer 130, and the second electrode 150 (the second carbon nanotube). The multilayer structure 160 defines a lateral cross section and a longitudinal section. The lateral cross section is a cross section parallel to the first surface 112 of the first semiconductor layer 110. The longitudinal section is a section perpendicular to the first surface 112 of the semiconductor layer 110. Since a size of the first carbon nanotube and a size of the second carbon nanotube are smaller relative to the first semiconductor layer 110, an area of the lateral cross section is determined by the diameter of the first carbon nanotube or the second carbon nanotube, the area of the lateral cross section of the multilayer structure 160 is also in nanometer size. An area of the longitudinal section is determined by the diameter of the first carbon nanotube, the second carbon nanotube and thicknesses of the first semiconductor layer 110, the second semiconductor layer 130, and the active layer 120. The diameter of the first electrode 140 (the first carbon nanotubes) and the diameter of the second electrode 160 (the second carbon nanotubes 0 are both in nanometers, and the thicknesses of the first semiconductor layer 110, the second semiconductor layer 130, and the active layer 120 are also in nanometers. Therefore, the area of the longitudinal cross section of the multilayer structure 160 is also in nanometers. In one embodiment, the area of the lateral cross section of the multilayer structure 160 ranges from 1 square nanometer to 100 square nanometers. Therefore, a vertical point p-n junction or a vertical point p-i-n junction can be formed by the first semiconductor layer 110 and the second semiconductor layer 130 at the multilayer structure 160.

In used, a forward voltage is applied to the light emitting diode 10, near the vertical point p-n junction or the vertical point p-i-n junction. Holes from the P region are injected into the N region to combine with electrons in N region, electrons from the N region are injected into the P region to combine with holes in the P region. Photons are generated by the active layer 120 in the vertical point p-n junction or the vertical point p-i-n junction to emit light. Therefore, an effective portion of the light emitting diode 10 is the multilayer structure 160 formed by the overlapping region of the first electrode 140 (the first carbon nanotube), the first semiconductor layer 110, the active layer 120, the second semiconductor layer 130, and the second electrode 150 (the second carbon nanotube). A size of the light emitting diode 10 only needs to be larger than a volume of the multilayer structure 160. Therefore, sizes of the light-emitting diode 10 can be reduced to nano-sizes, nano-size light-emitting diodes are obtained. Nano-sized light-emitting diodes will have important applications in the fields of future display and near-field optics. In one embodiment, a volume of the light-emitting diode 10 is less than 100 cubic nanometers. In one embodiment, the volume of the light-emitting diode 10 ranges from about 10 cubic nanometers to about 100 cubic nanometers. In one embodiment, the volume of the light-emitting diode 10 ranges from about 10 cubic nanometers to about 50 cubic nanometers.

Figure 3:
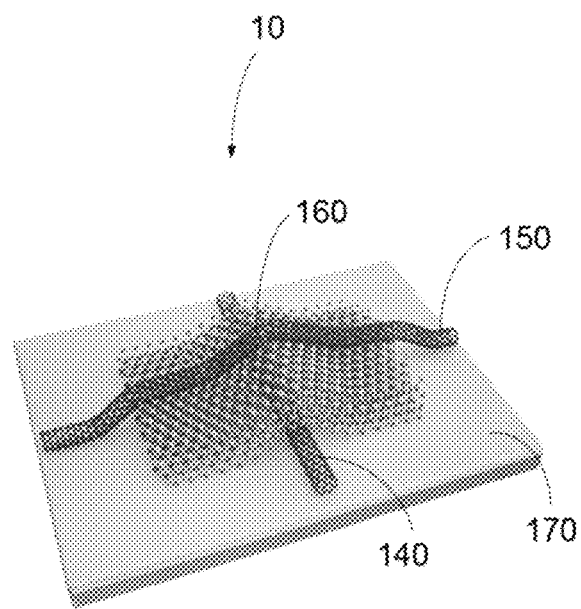
FIG. 3 is a top structural schematic view of one embodiment of the light emitting diode.

In one embodiment, the light-emitting diode 10 further comprises a substrate 170 (shown in FIG. 3). The first electrode 140, the first semiconductor layer 110, the active layer 120, the second semiconductor layer 130, and the second electrode 150 are sequentially stacked on a fifth surface of the substrate 170. The substrate 170 provides structural support to the elements on the substrate 170. The substrate 170 may be transparent and does not absorb light. A material of the substrate 170 can be SOI (silicon on insulator), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, GaP:Zn or GaP:N. In one embodiment, the material of the substrate 170 is silicon.

In one embodiment, the light-emitting diode 10 further comprises a reflective layer (no shown) located on a sixth surface of the substrate 170 opposite to the fifth surface of the substrate 170. A material of the reflective layer can be titanium, silver, aluminum, nickel, gold, or any combination thereof. After the photons generated in the active layer 120 reach the reflective layer, the photons can be reflected by the reflective layer 120 to emit from the light emitting surface of the light emitting diode 10, thereby improving light emitting efficiency of the light emitting diode 10.

In one embodiment, the third surface 132 of the second semiconductor layer 130 further comprises a plurality of three-dimensional nanostructures. The plurality of three-dimensional nanostructures can further improve a light extracting rate of the light emitting diode 10.

The light emitting diode 10 of the present disclosure has following characters. First, the light-emitting diode 10 is formed by two intersecting carbon nanotubes, sandwiching a two-dimensional semiconductor layer and an active layer. Since the diameters of the two carbon nanotubes are in nanometer size, at the intersection of the two carbon nanotubes, a nano-sized p-n junction or p-i-n junction is formed at the overlapping region of the two carbon nanotubes, the semiconductor layer, and the active layer. Therefore, the size of the light-emitting diode can be reduced to a nano-size, and a nano-size light-emitting diode is obtained. Nano-sized light-emitting diodes will have important applications in the fields of future display and near-field optics. Second, each of the two electrodes of the light emitting diode is a carbon nanotube. Since absorption or reflection of light by carbon nanotubes can be neglectable and carbon nanotubes have excellent light transmission, the light-emitting diode of the present disclosure has high light-emitting efficiency. Third, since carbon nanotubes have excellent electrical conductivity, using carbon nanotubes as electrodes for light-emitting diodes can reduce current loss and increase an effective working current of the light-emitting diode. Fourth, the two crossed carbon nanotubes can be inner shell carbon nanotubes. The inner shell carbon nanotubes provides clean surfaces with no impurities on the surface; therefore, the two crossed carbon nanotubes as the electrodes can be in good contact with the semiconductor layers.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A light emitting diode comprising:
a first semiconductor layer comprising a first surface and a second surface opposite to the first surface;
a second semiconductor layer comprising a third surface and a fourth surface opposite to the third surface;
an active layer between the first semiconductor layer and the second semiconductor layer, and in direct contact with the second surface and the fourth surface;
a first electrode on the first surface and in direct contact with the first surface; and
a second electrode on the third surface and in direct contact with the third surface,
wherein the first electrode comprises a first carbon nanotube, the second electrode comprises a second carbon nanotube, and a first extending direction of the first carbon nanotube and a second extending direction of the second carbon nanotube intersects with each other, and a multilayer structure is formed by an overlapping region of the first carbon nanotube, the first semiconductor layer, the active layer, the second semiconductor layer, and the second carbon nanotube; and a vertical p-n junction or a vertical p-i-n junction is formed by the first semiconductor layer and the second semiconductor layer at an intersection of the first carbon nanotube and the second carbon nanotube and in a direction perpendicular to the first surface of the first semiconductor layer.

2. The light emitting diode of claim 1, wherein the first electrode is a single first carbon nanotube, and the second electrode is a single second carbon nanotube.

3. The light emitting diode of claim 1, wherein the first semiconductor layer or the second semiconductor layer is a two-dimensional material.

4. The light emitting diode of claim 1, wherein a thickness of the first semiconductor layer ranges from approximately 0.5 nanometers to approximately 50 nanometers.

5. The light emitting diode of claim 4, wherein the first semiconductor layer is an N-type semiconductor layer with a thickness of approximately 16 nanometers, and a material of the N-type semiconductor layer is molybdenum sulfide.

6. The light emitting diode of claim 1, wherein a thickness of the active layer ranges from approximately 10 nanometers to approximately 100 nanometers.

7. The light emitting diode of claim 6, wherein the active layer is made of gallium nitride with a thickness of approximately 30 nanometers.

8. The light emitting diode of claim 1, wherein a thickness of the second semiconductor layer ranges from approximately 0.5 nanometers to approximately 50 nanometers.

9. The light emitting diode of claim 8, wherein the second semiconductor layer is made of tungsten selenide layer with a thickness of approximately 14 nanometers.

10. The light emitting diode of claim 1, wherein a diameter of the first carbon nanotube ranges from approximately 0.5 nanometers to approximately 10 nanometers.

11. The light emitting diode of claim 1, wherein the first carbon nanotube is an inner shell carbon nanotube made from an innermost wall of a double-walled carbon nanotube or a multi-walled carbon nanotube.

12. The light emitting diode of claim 11, wherein the inner shell carbon nanotube is pulled out from an ultra-long double-walled carbon nanotube or an ultra-long multi-walled carbon nanotube, and a length of the ultra-long double-walled carbon nanotube or the ultra-long multi-walled carbon nanotube is larger than 150 micrometers.

13. The light emitting diode of claim 12, wherein the length of the ultra-long double-walled carbon nanotube or the ultra-long multi-walled carbon nanotube ranges from approximately 150 micrometers to approximately 300 micrometers.

14. The light emitting diode of claim 1, wherein a diameter of the second carbon nanotube ranges from approximately 0.5 nanometers to approximately 10 nanometers.

15. The light emitting diode of claim 1, wherein the second carbon nanotube is an inner shell carbon nanotube made from an innermost wall of carbon nanotube of a double-walled carbon nanotube or a multi-walled carbon nanotube.

16. The light emitting diode of claim 1, wherein the first extending direction is perpendicular to the second extending direction.

17. The light emitting diode of claim 1, wherein the multilayer structure defines a lateral cross section, and an area of the lateral cross section of the multilayer structure ranges from 1.0 square nanometer to 100 square nanometers.

18. The light emitting diode of claim 1, further comprising a substrate, wherein the first electrode, the first semiconductor layer, the active layer, the second semiconductor layer, and the second electrode are sequentially stacked in a said order on a surface of the substrate.

19. The light emitting diode of claim 1, wherein the third surface of the second semiconductor layer further comprises a plurality of three-dimensional nanostructures.

20. The light emitting diode of claim 1, wherein a volume of the light-emitting diode ranges from approximately 10 cubic nanometers to approximately 50 cubic nanometers.

* * * * *